United States Patent
Oka

(10) Patent No.: US 9,865,781 B2
(45) Date of Patent: Jan. 9, 2018

(54) METHOD FOR MANUFACTURING LIGHT EMITTING DEVICE COMPRISING LENS WITH TAPERED PROFILE

(71) Applicant: NICHIA CORPORATION, Anan-shi, Tokushima (JP)

(72) Inventor: Yuta Oka, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/671,099

(22) Filed: Mar. 27, 2015

(65) Prior Publication Data

US 2015/0280052 A1 Oct. 1, 2015

(30) Foreign Application Priority Data

Mar. 28, 2014 (JP) .................. 2014-068802

(51) Int. Cl.
- *H01L 21/00* (2006.01)
- *H01L 33/54* (2010.01)
- *H01L 33/62* (2010.01)

(52) U.S. Cl.
CPC .............. *H01L 33/54* (2013.01); *H01L 33/62* (2013.01); *H01L 2224/48091* (2013.01); *H01L 2224/48247* (2013.01); *H01L 2224/48257* (2013.01); *H01L 2933/005* (2013.01)

(58) Field of Classification Search
CPC ......... H01L 33/54; H01L 33/00; H01L 33/52; B82Y 20/00
USPC .................................. 438/22, 27, 25, 26, 29
See application file for complete search history.

(56) References Cited

U.S. PATENT DOCUMENTS

| | | | | |
|---|---|---|---|---|
| 6,291,271 B1 * | 9/2001 | Lee | ...................... | H01L 21/568 257/E23.039 |
| 6,747,298 B2 * | 6/2004 | Slater, Jr. | ................ | H01L 33/40 257/190 |
| 6,969,874 B1 * | 11/2005 | Gee | ........................ | H01L 33/105 257/94 |
| 7,015,593 B2 * | 3/2006 | Kazama | ................ | H01L 21/561 257/684 |
| 7,842,526 B2 * | 11/2010 | Hadame | .................. | H01L 24/97 257/E33.068 |
| 7,889,421 B2 * | 2/2011 | Narendran | ............ | H01L 33/507 359/326 |
| 8,975,648 B2 * | 3/2015 | Oshima | .................. | H01L 33/56 257/100 |

(Continued)

FOREIGN PATENT DOCUMENTS

| | | | | |
|---|---|---|---|---|
| CN | 102114539 B | * | 1/2013 | ................ B22F 3/03 |
| JP | 2007-077491 A | | 3/2007 | |

(Continued)

*Primary Examiner* — Lex Malsawma
*Assistant Examiner* — Eric W Jones
(74) *Attorney, Agent, or Firm* — Squire Patton Boggs (US) LLP

(57) ABSTRACT

A manufacturing method for a light emitting device can include providing a bonding layer over a base, and disposing a shim plate with an opening over the bonding layer. A light emitting body is disposed over the bonding layer exposed from the opening of the shim plate. A lens is formed by approaching a die having a concave portion at its surface, to the shim plate, covering an upper surface of the light emitting body and an upper surface of the shim plate with a lens formation material within the concave portion, and then hardening the lens formation material.

12 Claims, 9 Drawing Sheets

(56) References Cited

U.S. PATENT DOCUMENTS

| | | | |
|---|---|---|---|
| 9,214,611 B2* | 12/2015 | Ooyabu | H01L 33/505 |
| 9,368,424 B2* | 6/2016 | Shinma | H01L 23/3128 |
| 2002/0014630 A1* | 2/2002 | Okazaki | H01L 33/405 |
| | | | 257/79 |
| 2006/0091788 A1* | 5/2006 | Yan | H01L 33/501 |
| | | | 313/502 |
| 2006/0118805 A1* | 6/2006 | Camras | H01L 33/58 |
| | | | 257/98 |
| 2006/0138937 A1* | 6/2006 | Ibbetson | F21K 9/00 |
| | | | 313/502 |
| 2007/0178629 A1* | 8/2007 | Ogawa | B29C 39/006 |
| | | | 438/113 |
| 2008/0203415 A1* | 8/2008 | Thompson | B29C 33/0022 |
| | | | 257/98 |
| 2009/0262517 A1* | 10/2009 | Suehiro | G02B 6/0023 |
| | | | 362/84 |
| 2010/0164346 A1* | 7/2010 | Li | F21S 10/02 |
| | | | 313/46 |
| 2010/0193821 A1* | 8/2010 | Fukasawa | H01L 24/97 |
| | | | 257/98 |
| 2010/0244071 A1 | 9/2010 | Wada et al. | |
| 2012/0037942 A1* | 2/2012 | Sanga | H01L 33/60 |
| | | | 257/98 |
| 2012/0205708 A1* | 8/2012 | Yoo | H01L 33/486 |
| | | | 257/99 |
| 2013/0187178 A1* | 7/2013 | Tischler | H01L 33/50 |
| | | | 257/88 |
| 2014/0091334 A1 | 4/2014 | Katayama et al. | |
| 2014/0203305 A1* | 7/2014 | Kawano | H01L 33/486 |
| | | | 257/88 |

FOREIGN PATENT DOCUMENTS

| | | |
|---|---|---|
| JP | 2007-273764 A | 10/2007 |
| JP | 2010-251666 A | 11/2010 |
| JP | 2011-077491 A | 4/2011 |
| JP | 2011-138815 A | 7/2011 |
| JP | 2014-090157 A | 5/2014 |

* cited by examiner

[Fig. 1A]
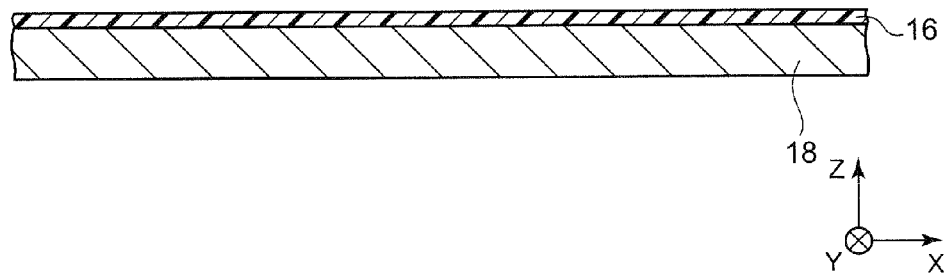
[Fig. 1B]
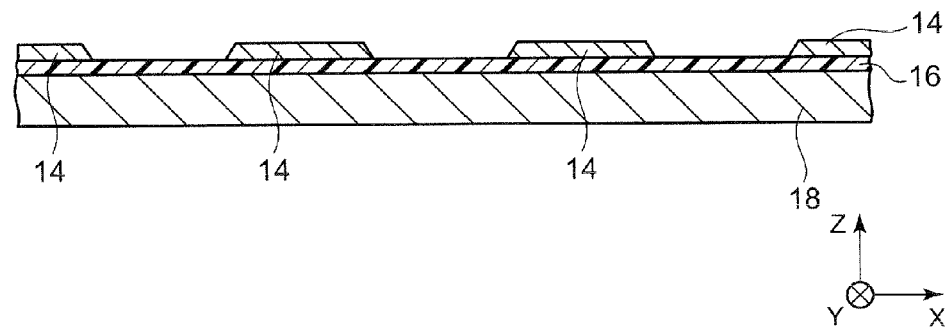
[Fig. 1C]
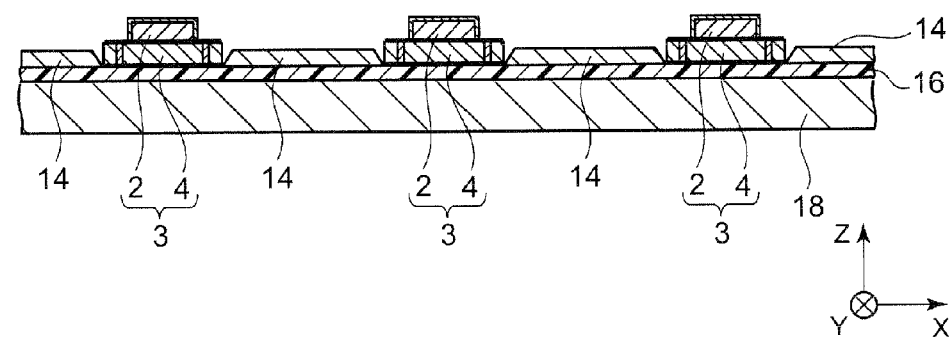

[Fig. 2A]
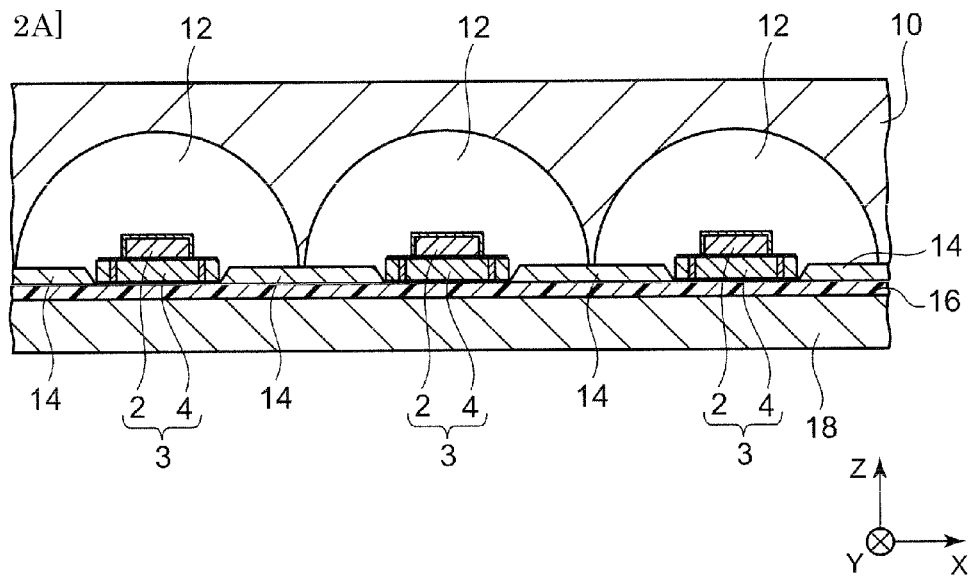
[Fig. 2B]
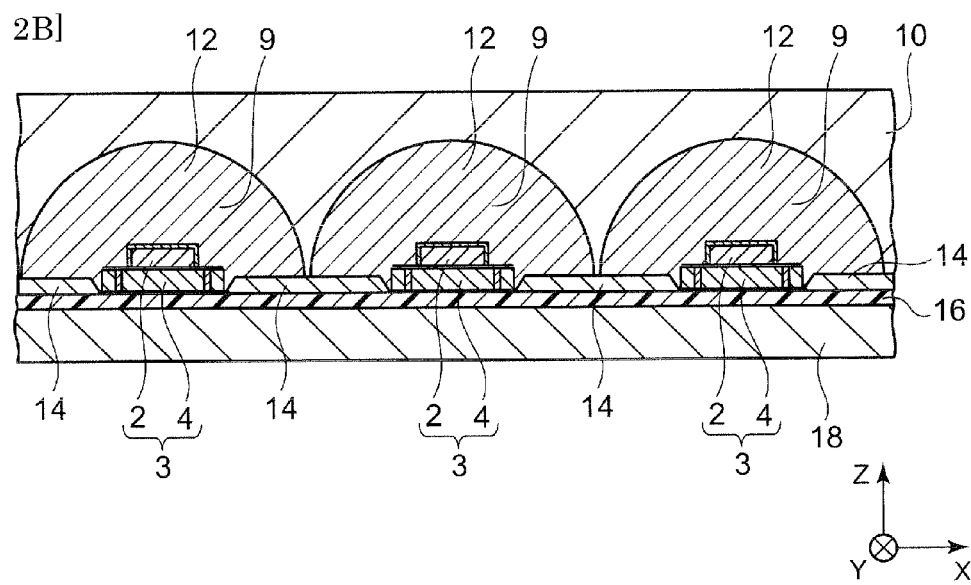

[Fig. 3]
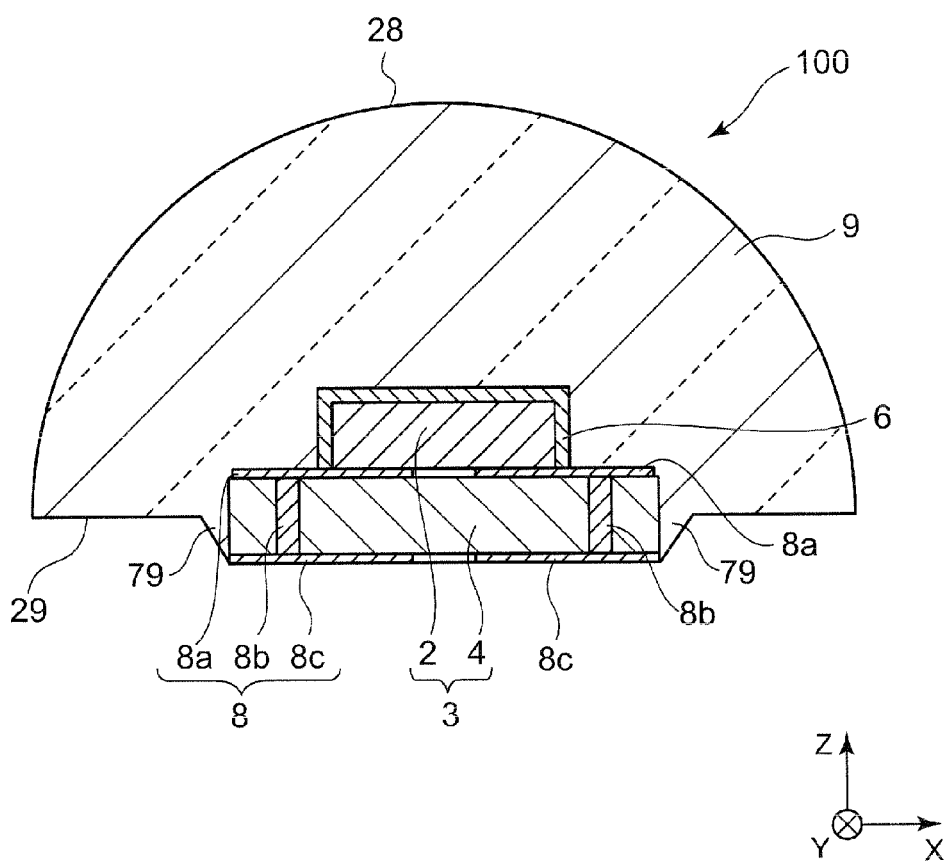

[Fig. 4]
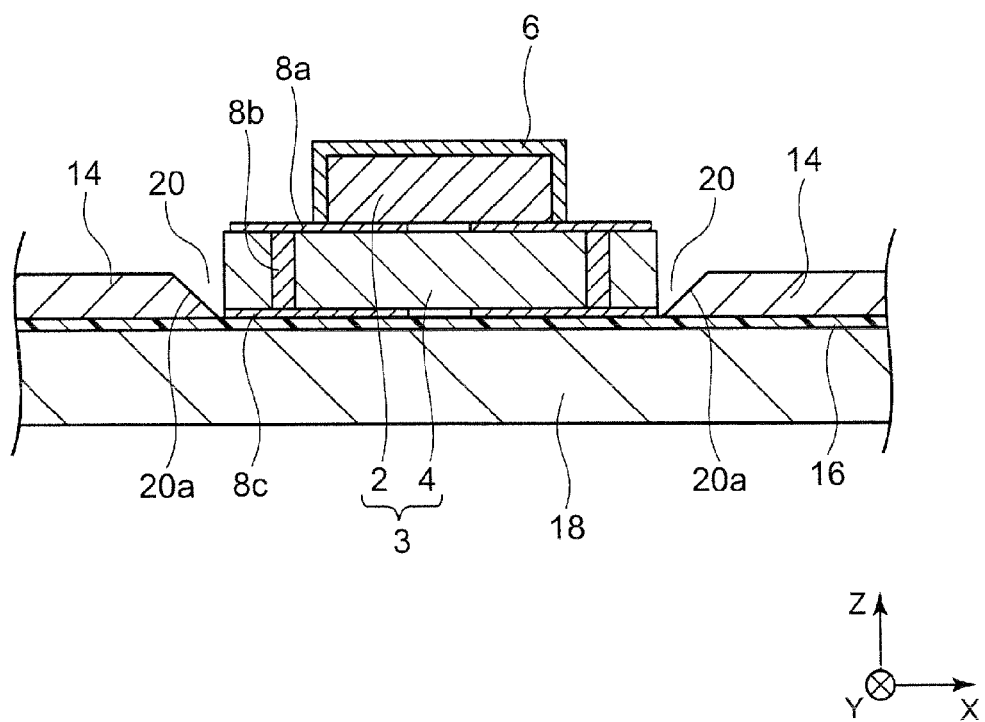

[Fig. 5A]
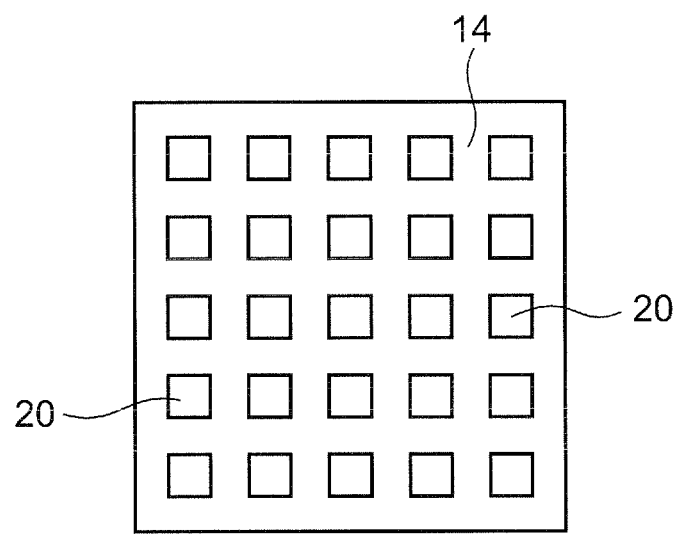
[Fig. 5B]
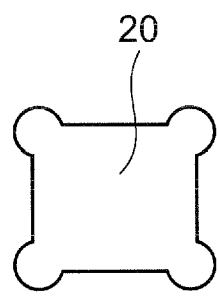

[Fig. 6]
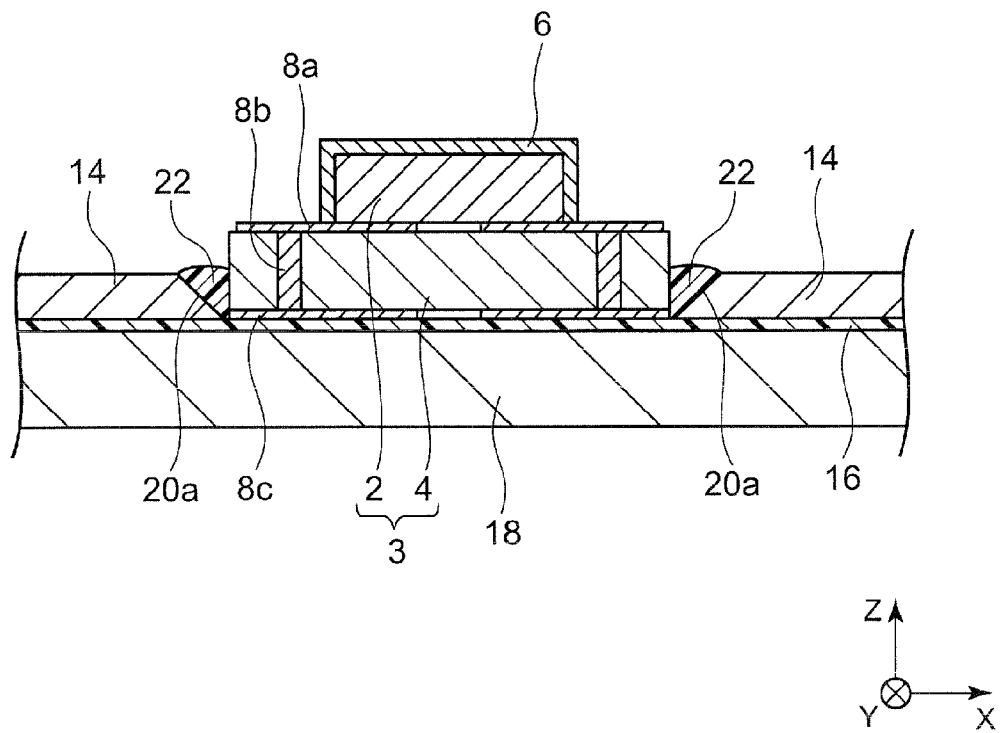
[Fig. 7]
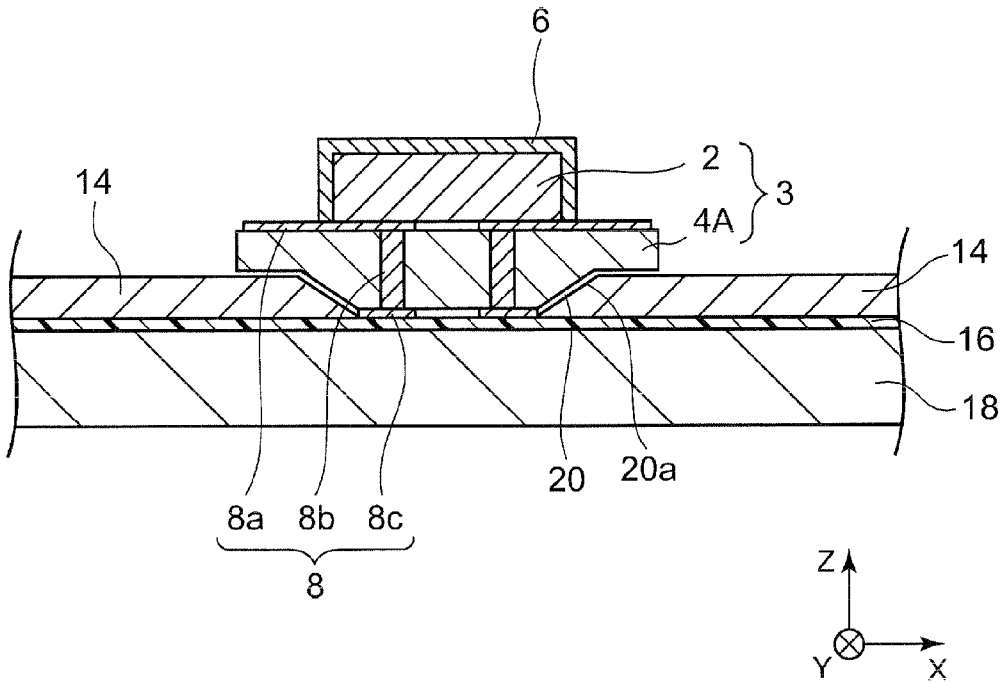

[Fig. 8]
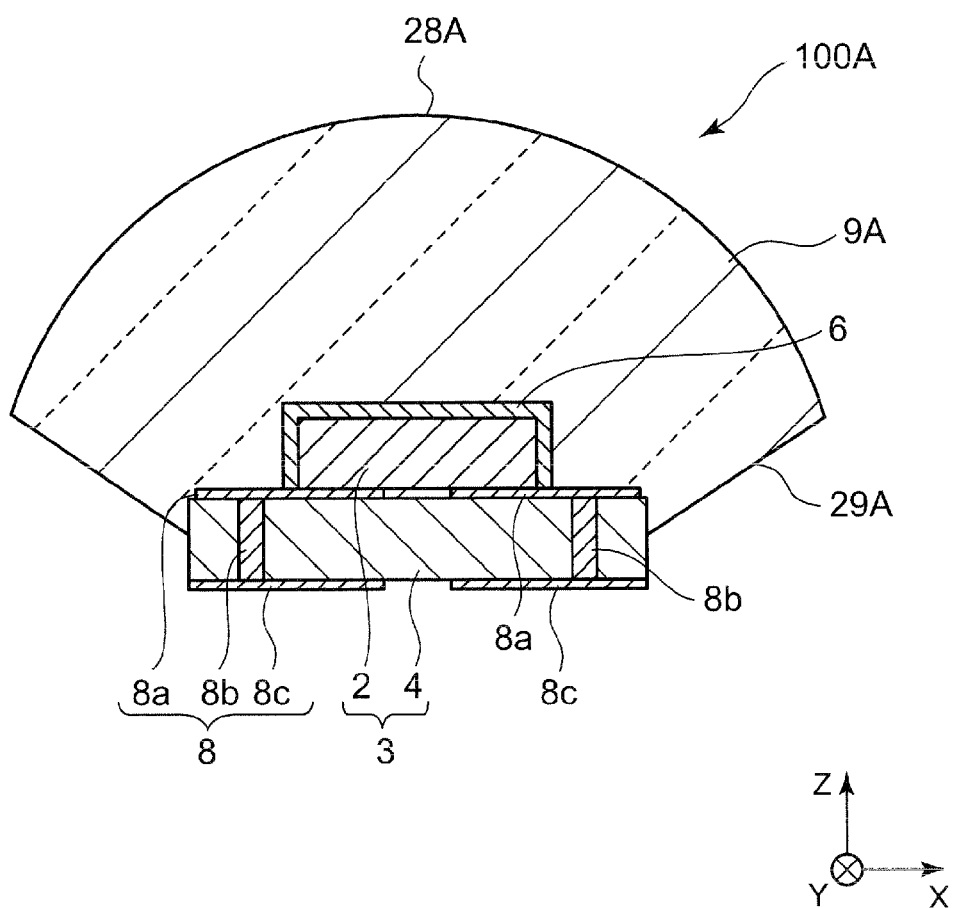

[Fig. 9]
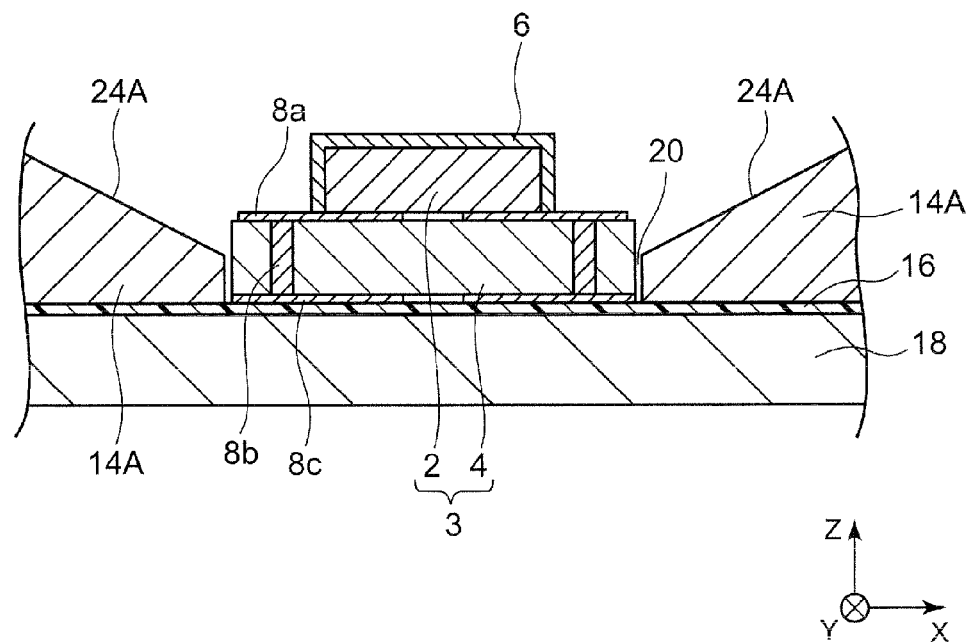

[Fig. 10A]
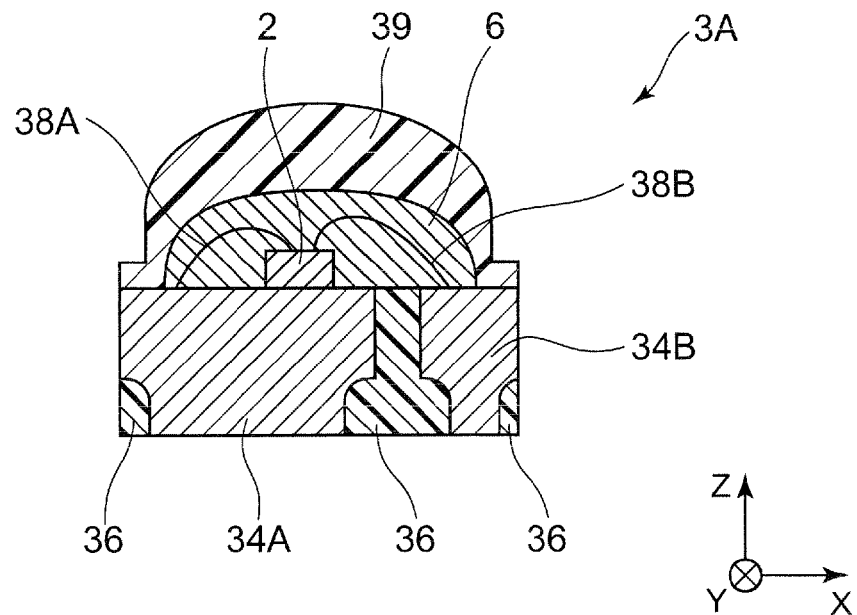
[Fig. 10B]
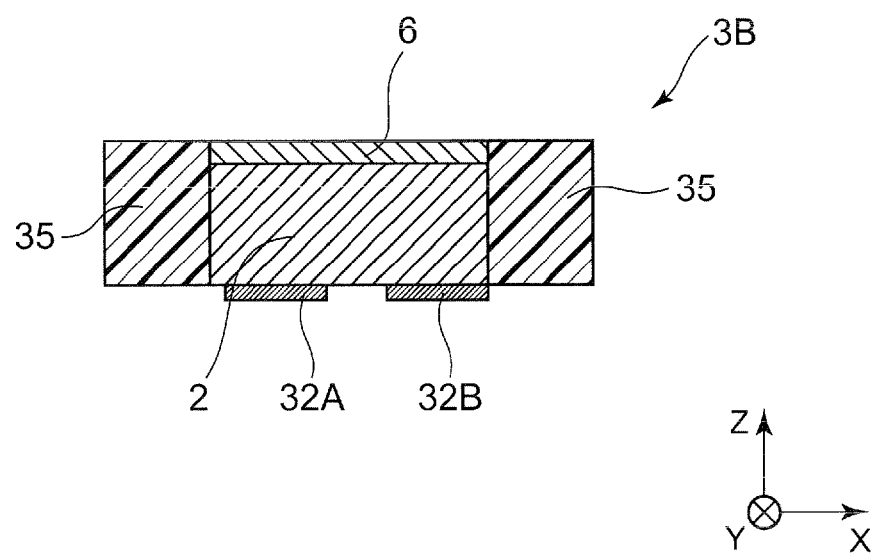

METHOD FOR MANUFACTURING LIGHT EMITTING DEVICE COMPRISING LENS WITH TAPERED PROFILE

CROSS-REFERENCE TO RELATED APPLICATION

This application claims priority on Japanese Patent Application No. 2014-68802, filed Mar. 28, 2014, the whole disclosure of which is incorporated by reference herein.

BACKGROUND OF THE INVENTION

Field of the Invention

The present disclosure relates to a method for manufacturing a light emitting device, and more particularly, to a method for manufacturing a light emitting device with a lens disposed to cover a light emitting element.

Description of the Related Art

Light emitting devices using a semiconductor chip (light emitting element), such as a light emitting diode, are widely used because of easy reduction in size and high light emission efficiency.

Some of these light emitting devices have, for example, a lens (sealing portion serving as a lens) for refracting a light emitted from the semiconductor chip in a desired direction in order to obtain a large amount of light in a specific direction, such as in an upper surface direction of a mounting substrate or the like. This kind of light emitting device with the lens is widely used for many applications, including illumination and backlight.

The lens used in such a light emitting device is normally disposed over the mounting substrate to cover the light emitting element. Most of the light emitted from the light emitting element refracts through the lens, and travels from the upper surface of the lens in the desired direction.

Such arrangement of the lens, however, brings most areas of a lower surface of the lens into contact with the surface of the mounting substrate. As a result, a part of the light emitted from the light emitting element, especially, light directed downward, reaches the mounting substrate through the lens. This is because when $n_1$ is a refractive index of a translucent material, such as glass or resin forming the lens, and $n_2$ is a refractive index of material forming the substrate, the total reflection does not occur as $n_2$ is larger than $n_1$, or a critical angle causing the total reflection becomes large due to a small difference between the refractive indexes $n_1$ and $n_2$ even though $n_1$ is larger than $n_2$.

Although a part of the light reaching the mounting substrate is reflected to return the lens again, most of the light reaching the mounting substrate then hits the mounting substrate and is absorbed in the substrate. The absorption of the light in the mounting substrate can be relieved by increasing the reflectivity of the surface of the mounting substrate. However, even by use of the known strategies for relieving the light absorption, a considerable amount of the light is absorbed in the mounting substrate, which may disadvantageously reduce a light extraction efficiency.

For this reason, a light emitting device is known which includes the lens (especially, the bottom surface of the lens) extended to the outside of the substrate in the planar view.

In such a light emitting device, the light emitting element is mounted on the mounting substrate. The light emitting element and the upper surface of the mounted substrate are disposed within the lens, and the lower surface of the mounting substrate protrudes (exposes) from the bottom surface of the lens.

A part of the bottom surface of the lens that extends to the outside of the mounting substrate is in contact with air. Air has a small refractive index, which leads to a large difference between the refractive index $n_1$ of the translucent material, such as glass or resin, forming the lens, and a refractive index $n_{air}$ of the air, thereby decreasing a critical angle causing the total reflection to a small value. As a result, most of the light emitted from the light emitting element and reaching the bottom surface of the lens can be reflected to suppress the amount of the light exiting out of the bottom surface of the lens to the outside.

Thus, the light emitting device with the lens (especially, the bottom surface of the lens) extended to the outside of the mounting substrate in the planar view can realize high light extraction efficiency, particularly, the high light extraction efficiency from the upper surface of the lens.

For example, methods disclosed in JP 2011-077491 A and JP 2007-273764 A are known as a method for manufacturing such a light emitting device with the lens extended to the outside of the mounting substrate in the planar view.

In the method disclosed in JP 2011-077491 A, a plurality of mounting substrates with light emitting elements mounted thereon is spaced apart from each other on a lower mold (lower side mold). A spacer is disposed between the adjacent mounting substrates with a spacing therebetween. Then, an upper mold (upper side mold) having at its lower surface a concave portion corresponding to the shape of the lens to be obtained is prepared. The upper mold is brought into contact with and press-fitted to the lower mold so as to place a light emitting element within the concave portion while charging a sealing member before hardening (material for the lens) into the concave portion. After that the sealing member is hardened to obtain the light emitting device with a desired lens shape.

The method disclosed in JP 2007-273764 A involves preparing an upper mold (upper mother mold) that holds a mounting substrate with a light emitting element mounted thereon over a lower surface of the mounting substrate, and a lower mold that has a concave portion corresponding to the shape of the lens to be obtained over an upper surface of the mounting substrate, a concave portion corresponding to the shape of the lens to be obtained, by using a chuck. The upper side mold and the lower side mold are brought into intimate contact with each other, whereby the mounting substrate and the light emitting element are disposed in the concave portion (chamber). Then, after decompressing the inside of the concave portion, a mixed solution including a monomer of thermosetting resin and polymerization catalyst is supplied into the concave portion. Then, the mixed solution is hardened, thereby obtaining a light emitting device with a lens having a desired shape.

In use of the method disclosed in JP 2007-077491 A, however, the sealing member before hardening comes around behind the lower surface of the mounting substrate, whereby a resin film might be formed at the lower surface of the mounting substrate of the light emitting device obtained.

The formation of the resin film on a wiring layer provided at the lower surface of the mounting substrate might cause the problem of conduction failure. In order to avoid the occurrence of the conduction failure, it is necessary to add a step of removing the resin film after formation of the lens.

On the other hand, in use of the method disclosed in JP 2007-273764 A, the bottom surface of the obtained lens may not become a flat surface or a smooth curved surface due to the shrinkage of resin upon hardening, which may cause asperity on the bottom surface (for example, whereby asperity may be formed on the bottom surface of the lens in the cross-sectional view). As a result, the total reflection may not occur in some cases.

SUMMARY

Accordingly, it is an object of the present disclosure to provide a method for manufacturing a light emitting device with a lens extending to the outside of a mounting substrate in the planar view and having a flat or smooth-curved lens bottom surface which can prevent the resin from coming around behind the lower surface of the mounting substrate in formation of the lens.

According to one embodiment of the present invention, a method for manufacturing a light emitting device is provided in which the light emitting device includes a light emitting body with a light emitting element, and a lens that seals an upper surface of the light emitting body, wherein a lower surface of the light emitting body is exposed from a bottom surface of the lens, and the bottom surface extends to an outside of the light emitting body in a top view from a direction vertical to the lower surface of the light emitting body. The method includes the steps of providing a bonding layer on a base, and disposing a shim plate with an opening on the bonding layer. The method also includes disposing the light emitting body on the bonding layer exposed from the opening of the shim plate, and forming the lens by approaching a die having a concave portion at a surface thereof, to the shim plate, covering an upper surface of the light emitting body and an upper surface of the shim plate with a lens formation material within the concave portion. The lens formation material is then hardened.

The manufacturing method according to embodiments of the present invention can prevent the resin from coming around behind the lower surface of the mounting substrate in forming the lens. Thus, the light emitting device having a lens extending to the outside of the mounting substrate in the planar view can be obtained, and the bottom surface of the lens in the obtained light emitting device has a flat surface or a smooth curved surface.

BRIEF DESCRIPTION OF THE DRAWINGS

FIGS. 1A to 1C are schematic cross-sectional views showing a method for manufacturing a light emitting device 100 according to one embodiment shown in FIG. 3.

FIGS. 2A and 2B are schematic cross-sectional views showing a method for manufacturing the light emitting device 100 according to one embodiment shown in FIG. 3.

FIG. 3 is a schematic cross-sectional view showing the light emitting device 100 according to one embodiment.

FIG. 4 is a schematic cross-sectional view showing an arrangement of a light emitting body 3 disposed in an opening 20 of a shim plate 14 according to one embodiment.

FIG. 5A is a schematic top view of a shim plate 14; FIG. 5B is an enlarged view of the opening 20 according to one embodiment shown in FIG. 5A.

FIG. 6 is a schematic cross-sectional view showing an embodiment in which a sealing resin 22 is disposed between a side surface of the opening 20 and a mounting substrate 4.

FIG. 7 is a schematic cross-sectional view showing an embodiment in which the mounting substrate has a tapered portion.

FIG. 8 is a schematic cross-sectional view showing a light emitting device 100A in a modified example of an embodiment of the invention.

FIG. 9 is a schematic cross-sectional view showing an arrangement of the light emitting body 3 disposed in an opening 20 of a shim plate 14A according to one embodiment.

FIG. 10A is a schematic cross-sectional view showing a light emitting body 3A; and FIG. 10B is a schematic cross-sectional view showing a light emitting body 3B.

DETAILED DESCRIPTION OF THE PREFERRED EMBODIMENTS

Preferred embodiments of the invention will be described in detail below with reference to the accompanying drawings. In the description below, if necessary, the terms indicative of the specific direction or position (for example, "upper", "lower", "right", "left" and other words including these words) are used for easy understanding of embodiments of the invention with reference to the figures. The meanings of the terms do not limit the scope of the invention. The same parts or the same members are designated by the same reference numerals throughout the drawings.

Some of these drawings are partially exaggerated for purposes of easy understanding of the embodiments of the present invention. It is noted that the scale size and relative arrangement or the like may be different from those of actual goods associated with the invention.

FIGS. 1A to 1C and FIGS. 2A and 2B are schematic cross-sectional views showing a method for manufacturing alight emitting device 100 shown in FIG. 3. FIG. 3 is a schematic cross-sectional view showing the light emitting device 100.

The light emitting device 100 will be described below, before description of a manufacturing method according to one embodiment of the invention with reference to FIGS. 1A to 1C and 2A and 2B.

The light emitting device 100 includes a light emitting body 3 having a mounting substrate 4 and a light emitting element 2 mounted (or placed) on the mounting substrate 4, and a lens 9.

The light emitting element 2 includes a semiconductor layer, and if necessary, can also include a phosphor layer 6 covering the outer surface of the semiconductor layer. The semiconductor layer includes a p-type semiconductor layer and an n-type semiconductor layer, and emits light from between these semiconductor layers. The semiconductor layer may include an active layer (light emission layer) between the p-type semiconductor layer and the n-type semiconductor layer, if necessary.

Wiring patterns 8 for supplying electric power to the light emitting element 2 are formed on the surface of or inside the mounting substrate 4.

More specifically, two upper surface wiring patterns 8a are arranged on the upper surface of the mounting substrate 4 (main surface on the side in a Z direction of FIG. 3). One of the two upper surface wiring patterns 8a is electrically connected to the p-type semiconductor layer of the light emitting element 2, and the other is electrically connected to the n-type semiconductor layer of the light emitting element 2. The two upper surface wiring patterns 8a can be electrically connected to wirings or the like provided outside the light emitting device 100, for example, via a substrate through wiring 8b, such as a through via hole, and a lower surface wiring 8c.

As such an external wiring, for example, a wiring pattern provided on a secondary substrate (a second substrate) can be exemplified. For example, the bottom surface of the light emitting body 3 (lower surface of the mounting substrate 4)

is mounted on the upper surface of the secondary substrate, so that the lower surface wiring pattern on the mounting substrate 4 can be electrically connected to the wiring pattern on the secondary substrate. Thus, the electric power can be supplied from the external power source to the light emitting element 2 of the light emitting body 3.

The lens 9 has an upper surface 28 and a bottom surface 29, and a part of the light emitting body 3 is embedded in the lens 9 from the bottom surface 29. More specifically, the light emitting element 2 and the upper surface of the mounting substrate 4 (a main surface on a Z side of the two main surfaces in parallel to the X-Y surface of the mounting substrate 4 as shown in FIG. 3) are embedded in the lens 9 (that is, the light emitting element 2 and the upper surface of the mounting substrate 4 are sealed inside the lens 9). The lower surface of the mounting substrate 4 ("-Z" side surface of the two main surfaces parallel to the X-Y surface of the mounting substrate 4 as shown in FIG. 3) is exposed from the bottom surface 29 of the lens 9.

In the embodiment shown in FIG. 3, the entire light emitting element 2 is sealed within the lens 9. The mounting substrate 4 has its entire upper surface sealed within the lens 9, and its four side surfaces partially disposed inside the lens 9. As a result, the lower surface of the mounting substrate 4 protrudes the bottom surface 29 of the lens 9 to be exposed.

With this arrangement, the light emitted from the light emitting element 2 can be surely guided to the inside of the lens 9. For example, even in the case where the lower surface of the mounting substrate 4 is placed on a flat part, such as the upper surface of the secondary substrate (that is, in the case where the light emitting device 100 is disposed on a flat part of a wide substrate or the like), a part of the bottom surface 29 of the lens 9 that extends to the outside of the mounting substrate 4 in the top view (hereinafter referred to as an "outside extending part") can be securely brought into contact with air that has a lower refractive index than that of the substrate material or the like.

The lens 9 has its bottom surface 29 extending to the outside of the mounting substrate 4 in the top view from the direction (Z direction) vertical to the lower surface of the mounting substrate 4 (that is, bottom surface of the light emitting body 3). In other words, the bottom surface 29 has an "outer extending portion" extending to the outside of the mounting substrate 4.

In the embodiment shown in FIG. 3, the lens 9 has a hemispherical shape. Thus, the upper surface 28 has a spherical surface (hemispherical surface), and the bottom surface 29 is a flat surface except for a part where the mounting substrate 4 and the light emitting element are embedded. That is, the outer extending portion is a flat surface.

Preferably, the length in the lateral direction (in the X direction of FIG. 3) and the length in the longitudinal direction (in the Y direction of FIG. 3) of the light emitting body 3 are shorter than the outer diameter of the lens 9. In the embodiment shown in FIG. 3, the length of the lateral direction and the longitudinal direction of the light emitting body 3 is the same as those of the mounting substrate 4) Thus, around the entire outer periphery of the light emitting body 3, the bottom surface 29 of the lens 9 extends to the outer side of the light emitting body 3 (or mounting substrate 4) as shown in FIG. 3. That is, the outer extending portion of the bottom surface 29 of the lens 9 is formed over the entire outer periphery of the light emitting body 3 (or mounting substrate 4).

However, this embodiment is not limited thereto. Alternatively, for example, one of the length in the lateral direction and the length in the longitudinal direction of the light emitting body 3 (or mounting substrate 4) may be longer than the outer diameter of the lens 9, and the other may be shorter than the outer diameter of the lens 9. Thus, the bottom surface 29 of the lens 9 in a part of the outer periphery of the light emitting body 3 (or mounting substrate 4) may be extended to the outside of the light emitting body 3 (or mounting substrate 4).

The part of the bottom surface 29 of the lens 9 that extends to the outside of the light emitting body 3 (or mounting substrate 4) is in contact with air having the lower refractive index as mentioned above. Thus, in this part, the critical angle of the total reflection becomes small, so that most of the light emitted from the light emitting element 2 and reaching the part is reflected to travel through the lens 9.

In this way, the high light extraction efficiency can be obtained.

Note that the light emitting body 3 (or mounting substrate 4 and light emitting element 2) are preferably positioned at the substantially center of the lens 9 in the top view because the light exiting from the lens 9 (especially, from the upper surface 28 of the lens 9) becomes uniform.

The method for manufacturing the light emitting device 100 will be described in detail below.

As shown in FIG. 1A, after a bonding layer 16 is formed on a base (for example, a lower die) 18, a shim plate 14 is disposed on the bonding layer 16 as shown in FIG. 1B. As shown in FIG. 1C, the light emitting body 3 including the mounting substrate 4 and the light emitting element 2 mounted on the upper surface of the mounting substrate 4 is disposed in an opening 20 formed in the shim plate 14.

FIG. 4 is a schematic cross-sectional view showing the arrangement of the light emitting body 3 disposed in the opening 20 of the shim, plate 14. FIG. 4 corresponds to an enlarged view of a peripheral part of one mounting substrate 4 and the like out of the plurality of mounting substrates 4 and the like shown in FIGS. 1A-1C.

FIG. 5A is a schematic top view of the shim plate 14, and FIG. 5B is an enlarged view of the opening 20 shown in FIG. 5A.

The bonding layer 16 is provided on the base 18, whereby the shim plate 14 can be easily fixed thereto. The lower surface of the mounting substrate 4 (that is, the bottom surface of the light emitting body 3) is fixed to the bonding layer 16 exposed from the opening 20 of the shim plate 14 fixed to the upper surface of the base 18 to thereby form the lens 9. This arrangement can prevent a lens formation material made of resin before hardening, for example from coming around behind the lower surface of the mounting substrate 4 (bottom surface of the light emitting body 3).

The bonding layer 16 may be made of, for example, the known resin with any adhesiveness, such as a silicone-based resin or an acrylic resin.

Preferable examples of the bonding layer 16 can include a resin tape with an adhesive applied to its surface. Further, preferable examples of the resin tape can include a tape made of polyimide resin (polyimide tape).

In the case of using the resin tape with the adhesive applied as the bonding layer 16, the adhesive is preferably applied only to the upper surface of the resin tape. This is because the fixing of the base 18 onto the resin tape with the adhesive may degrade the workability in handling after molding. Even in the case where the adhesive is not applied to the lower surface of the resin tape, in a step of forming the lens 9 to be mentioned in detail, the base 18 is brought into intimate contact with the lower surface of the resin tape in clamping the mold 10 and the base 18.

However, this embodiment is not limited thereto, and for example, an adhesive may be applied to both surfaces of the adhesive tape.

The shim plate 14 may be formed of any material, such as metal, e.g., stainless steel or aluminum, and resin, e.g., PET, PP, PS, PMMA, ABS, PA, PC and PLA.

The shim plate 14 has at least one or more openings 20. Preferably, as shown in FIG. 5, the shim plate 14 has a plurality of openings 20, particularly, the openings 20 arranged side by side. This is because this arrangement can form the plurality of light emitting devices 100 at one time, thereby improving the productivity.

The shape of the opening 20 may be any shape, such as a square shape and a rectangle shape in the top view. In the embodiment shown in FIG. 5B, the opening 20 has a square shape having an arc-shaped curved portion at each corner thereof.

A height of a space formed under the bottom surface 29 of the lens 9 in the obtained light emitting device 100 that is, a distance between a bottom surface 29 and the bottom surface of the light emitting body 3 (or lower surface of the mounting substrate 4) can be adjusted by setting a thickness of the shim plate 14 to an appropriate value. That is, the shim plate 14 serves as a spacer for forming a space under the bottom surface 29.

The lens formation material is in contact with the upper surface of the shim plate 14 to be mentioned later, thereby forming the bottom surface 29 of the lens 9. If the upper surface of the shim plate 14 has asperity, the shape of the upper surface might reflect the bottom surface 29, thus inhibiting the total reflection of the light from the light emitting element 2. Thus, the upper surface of the shim plate does not preferably have such asperity. When the bottom surface (outer extending portion) 29 of the lens 9 is a flat surface, like the light emitting device shown in FIG. 1, the upper surface of the shim plate 14 is a flat surface (without having significant asperity).

As shown in FIG. 4, the opening 20 preferably has a tapered part expanding from the lower surface of the shim plate 14 toward the upper surface thereof (upward). In other words, the side surface 20a preferably forms the tapered part.

The light emitting body 3 can be easily inserted into the opening 20 because the upper surface side of the opening 20 is wide. The light emitting body 3 or the like can be disposed in a predetermined position on the bonding layer 16 (that is, over the base 18) with high accuracy because the lower surface side of the opening 20 is narrow.

When the opening 20 has a tapered part, as shown in FIG. 4, there sometimes occurs a space between the side surface of the opening 20 of the shim plate 14 and the side surface of the mounting substrate 4 when the light emitting body 3 is positioned in the opening 20. Even in the case where the opening 20 does not have a tapered part, there occurs a space between the side surface of the opening 20 of the shim plate 14 and the side surface of the mounting substrate 4 in some cases when the light emitting body 3 is positioned in the opening 20.

The lens formation material fills in the space, whereby the lens 9 of the light emitting device 100 has a descending portion 79 as shown in FIG. 3 in some cases. The descending portion 79 has a short width (length in the X direction of FIG. 3) of about 50 μm (e.g., 0.2 mm or less), and thus is normally negligible. In this case, even in the presence of the descending portion 79, the descending portion 79 may be neglected, and the bottom surface 29 shown in the figure, which extends parallel to the X direction in FIG. 3, may be further extended, and the part intersecting the side surface of the mounting substrate 4 may be a boundary between the mounting substrate 4 and the bottom surface 29.

FIG. 6 is a schematic cross-sectional view showing an embodiment in which a sealing resin 22 is disposed between the side surface of the opening 20 and the mounting substrate 4.

As shown in FIG. 6, the space between the side surface 20a of the opening 20 and the side surface of the mounting substrate 4 as shown in FIG. 4 may be filled with the sealing resin (resin) 22 by means of, for example, resin potting and the like. The arrangement of the sealing resin 22 can surely avoid causing the lens formation material to come around behind the bottom surface (lower surface of the mounting substrate 4) of the light emitting body 3.

An example of preferable resins used for the sealing resin 22 can be silicone resin.

The thus-obtained sealing resin 22 may be removed after forming the lens 9, as needed.

In the case of using the light emitting device 100 without removing the sealing resin 22, the sealing resin 22 is preferably formed of light reflective resin so as to prevent the light in the lens 9 from leaking to the upper surface of the mounting substrate 4 via the sealing resin 22. Note that in the case where the light emitting device 100 has the sealing resin 22, the terms "lens 9" and "bottom surface 29" indicate the concept that does not include the sealing resin 22.

FIG. 7 is a schematic cross-sectional view showing another embodiment in which the mounting substrate has a tapered part.

As can be seen from the cross-sectional view of FIG. 7, in the embodiment shown in FIG. 7, the mounting substrate 4A has the tapered part narrowed from the upper side to the lower side (toward a "-Z" direction of FIG. 7). In other words, mounting substrate 4A has the tapered part on its side surface.

The mounting substrate 4A may have the same structure as the mounting substrate 4 except for the presence of the tapered part.

In the embodiment shown in FIG. 7, like the embodiment shown in FIG. 4, the opening 20 preferably has the tapered part expanding from the lower surface of the shim plate 14 toward the upper surface thereof (upward). That is, the side surface 20a preferably forms the tapered part.

Thus, as shown in FIG. 7, the side surface 20a of the opening 20 and the side surface of the mounting substrate 4A face each other across the wider area. This can improve the accuracy of aligning the mounting substrate 4A on the bonding layer 16. In addition to that the lens formation material can be more surely prevented from passing through the gap between the side surface 20a of the opening 20 and the side surface of the mounting substrate 4A and then reaching the lower surface of the mounting substrate 4A (particularly, reaching a part in contact with the bonding layer 16 that is, part with the lower surface wiring 8c formed therein, can be prevented).

Even in the case where the side surface 20a of the opening 20 does not have the above-mentioned tapered part, the tapered part of the mounting substrate 4A has the following effects.

Since the mounting substrate 4A has the tapered part at its lower side, the width of the lower end side of the mounting substrate 4A becomes narrow, which can facilitate insertion of the shim plate 14 into the opening 20. On the other hand, the width of the mounting substrate 4A is widened at the upper end side of the tapered part. Thus, on the upper surface side of the shim plate 14, a distance between the side surface 20a and the side surface of the mounting substrate 4A becomes shorter, which can improve the accuracy of alignment when the mounting substrate 4A is disposed on the bonding layer 16. Due to the presence of the part having the short distance, the lens formation material can be surely prevented from reaching the lower surface of the mounting substrate 4A (particularly, reaching a part in contact with the bonding layer 16, that is, apart where the lower surface wiring 8c is formed can be prevented).

In the embodiment shown in FIG. 7, the tapered part is provided only in the lower part of the mounting substrate 4A. The upper part of the mounting substrate 4A does not have any tapered part, and thus its side surface in the upper part is vertical to its upper surface. In this case, the tapered part provided in the lower part of the mounting substrate 4A is preferably provided only in the part of the mounting substrate 4A that is inserted into the opening 20 of the shim plate 14. Thus, as shown in FIG. 7, the lower surface of the other part of the mounting substrate 4A (non-tapered part) can be disposed close to the upper surface of the shim plate 14 shown in FIG. 7. As a result, the gap between the lower surface of the non-tapered part of the mounting substrate 4A and the upper surface of the shim plate 14 can be narrowed. Also, this part can prevent the lens formation material from penetrating to a part of the lower surface of the mounting substrate 4A in contact with the bonding layer 16 that is, the part at which the lower surface wiring 8c is formed.

However, the shape of the tapered part is not limited thereto, and for example, a taper may be formed along the entire side surface, that is entire surface in the height direction (in the Z direction of FIG. 7) of the mounting substrate 4A.

In the method mentioned above, after disposing the mounting substrate 4 (or mounting substrate 4A) with the light emitting element 2 mounted thereon on the bonding layer 16, as shown in FIG. 2A, a mold (for example, upper mold) 10 with concave portions (cavities) 12 on its surface is set close to the shim plate 14. Then, as shown in FIG. 2B, the lens formation material in each concave portion 12 covers an upper surface of the shim plate 14, and an upper surface of the light emitting body 3. In the embodiment shown in FIG. 2B, the upper surface of the light emitting element 2 and the upper surface of the mounting substrate 4 (or the mounting substrate 4A) are covered. Note that unless otherwise specified, the term "mounting substrate 4" can be hereinafter referred to as the mounting substrate 4A in addition to the mounting substrate 4. Thus, the lens formation material can be formed in the shape of the lens 9 that is to be obtained.

More specifically, as shown in FIG. 2A, for example, a part of the lower surface of the mold 10 without the concave portion 12 is pressed against (brought into contact with) the upper surface of the shim plate 14, whereby the mold 10 and the base 18 are clamped via the shim plate 14 and the bonding layer 16. The light emitting element 2 is positioned within the concave portion 12, and preferably at least apart of the mounting substrate 4 is also positioned within the concave portion 12.

Then, for example, the lens formation material, such as resin before hardening, is supplied from a supply port provided in the mold 10 to fill the concave portion 12 with the lens formation material. Before supplying the lens formation material into the concave portion 12, the inside of the concave portion 12 may be decompressed as needed.

Note that in the case where the light emitting element 2 covers the entire upper surface of the mounting substrate 4, the mounting substrate 4 is covered with the lens formation material via the light emitting element 2.

When the lens formation material has a certain viscosity, the lens formation material may cover the upper surface of the light emitting body 3 (the upper surface of the light emitting element 2, and the mounting substrate 4), and the upper surface of the shim plate 14 within the concave portion 12 by compression molding. That is, after covering the upper surface of the light emitting element 2, the upper surface of the mounting substrate 4, and the upper surface of the shim plate 14 with the lens formation material in advance, the part of the mold 10 without the concave portion 12 can be pressed against the upper surface of the shim plate 14. Thus, the upper surface of the light emitting element 2, the upper surface of the mounting substrate 4, and the upper surface of the shim plate 14 can be covered with the lens formation material within the concave portion 12 to fill the inside of the concave portion 12 with the lens formation material.

In this case, an exhaust path for exhausting the air from the concave portion 12 may be provided in the mold 10 or the like as needed.

Further, in the state of vertically (in the Z direction) reversing the state shown in FIGS. 2A and 2B (that is, in the state in which the base 18 is positioned at an upper side, the mold 10 is positioned at a lower side, and the concave portion 12 is formed at the upper surface of the mold 10), the lens formation material may be disposed in the concave portion 12 in advance. In this state, the base 18 and the mold 10 may be set close to each other (for example, a part of the mold 10 without the concave portion 12 may be brought into contact with the upper surface of the shim plate 14). The upper surface of the light emitting body 3 (light emitting element 2 and mounting substrate 4) and the upper surface of the shim plate 14 may be covered with the lens formation material within the concave portion 12, and the concave portion 12 may be filled with the lens formation material.

Instead of the compression molding, transfer molding may be used to form the lens 9. For example, a through hole leading from the concave portion 12 to the outside of the mold 10 may be provided in the mold 10. Then, the lens formation material may be pushed into the mold via the through hole using the base 18 as the lower die, so that the lens 9 can be formed by the transfer molding.

The lens 9 may be formed of any material with light-transmissiveness for light emitted from the light emitting body 3, that is, light emitted from the light emitting element 2 and the light emitted from the phosphor layer 6 (in the case of using of the phosphor layer 6). For example, the lens 9 can be made of transparent resin or glass. Such resins can include, for example, a rigid silicone resin, and an epoxy resin.

The lens formation material for use may be any material that can be supplied into the concave portion 12 to cover the upper surface of the light emitting body 3 (light emitting element 2 and mounting substrate 4) and the upper surface of the shim plate 14, thereby forming the desired shape of the lens 9 to be obtained, followed by hardening. Lens formation materials can include, for example, a liquid resin containing a curing agent, and a molten glass. Preferable lens formation materials can include, for example, a silicone resin containing a curing agent and an epoxy resin containing a curing agent.

In this way, after the desired shape is formed with the lens formation material, the lens formation material is hardened to obtain the lens 9.

Note that the hardening of the lens formation material may involve temporarily hardening the lens formation material to such a degree that the lens formation material does not flow even with the mold 10 spaced apart from the base 18, separating the mold 10 from the base 18, and further after separating the bonding layer 16 from the mounting substrate 4, hardening the lens formation material to thereby obtain the lens 9.

Alternatively, in the case where the lenses 9 of the different light emitting devices 100 are connected to each other due to penetration of the lens formation material between the upper surface of the shim plate 14 and a part of the lower surface of the mold 10 without the concave portion 12 or the like, for example the bonded parts may be removed by cutting (further polishing as needed) or the like, thereby singulating the substrates into the light emitting devices 100.

In this way, the light emitting device 100 can be obtained.

The details of the light emitting element 2 and the mounting substrate 4 which are included in the light emitting body 3 will be described below.

The light emitting element 2 is a semiconductor element, such as a LED chip. A specific example of the semiconductor layer included in the light emitting element 2 can have the structure including an n-type semiconductor layer, an active layer (light emission layer) and a p-type semiconductor layer stacked over a side of the substrate made of sapphire, etc. in that order. Examples of the semiconductor for use can include a GaN based compound semiconductor which is a nitride semiconductor.

Note that the light emitting element 2 is not limited to such structure, but may have other semiconductor materials, or may further have a protective layer or a reflective layer, as appropriate.

In the case where the light emitting element 2 includes the phosphor layer 6, phosphors used in the phosphor layer 6 can include a YAG-based or LAG-based phosphor activated by cerium, which emit yellow light, a silicate-based phosphor, such as $(Sr, Ba)_2SiO_4:Eu$, and a combination thereof. Note that the phosphors are not limited to those emitting yellow light. Any phosphors that emit blue light, green light and red light may be used. Each of these phosphors may be singularly used, or a plurality of kinds of phosphors may be combined in use. Alternatively, a quantum-dot phosphor may be used.

The mounting substrate 4 can be formed using, e.g., ceramics such as aluminum nitride or alumina, glass epoxy, resin, or the like.

In the mounting substrate 4, the metal layer used for the upper surface wiring pattern 8a and the lower surface wiring pattern 8c is preferably formed of material having good conductivity and having a high reflectivity with respect to the light with the same wavelength as that of the light emitted from the light emitting element 2. For example, in order to ensure the conductivity, the wiring pattern is formed using Ti/Pt/Au or the like, and in order to improve the reflectivity, a single layer film or a multi-layer film may be formed of Ag, Al, Rh, or the like as a superficial layer.

The through wiring 8b of the mounting substrate 4 may be a via formed of, for example, copper plating and the like.

The light emitting element 2 may be mounted (placed) on the mounting substrate 4 by a known method, such as flip-chip mounting.

The light emitting body usable in the embodiments of the invention is not limited to the light emitting body 3 including the light emitting element 2 and the mounting substrate 4, but may use any known light emitting body including the light emitting element. Such a light emitting body will be exemplified in the following.

FIG. 10A is a schematic cross-sectional view illustrating a light emitting body 3A, and FIG. 10B is a schematic cross-sectional view illustrating a light emitting body 3B.

The light emitting body 3A includes a first lead 34A, a second lead 34B and a light emitting element 2. The first lead 34A and the second lead 34B are disposed in a resin package 36. The light emitting element 2 is disposed on the first lead 34A. The light emitting element 2 is electrically connected to the first lead 34A by a first metal wire 38A, and electrically connected to the second lead 34B by a second metal wire 38B. The first lead 34A and the second lead 34B are exposed from the bottom surface of the resin package 36. For example, exposed parts are electrically connected to the wirings on the secondary substrate, so that the light emitting element 2 can be electrically connected to an external power source. The light emitting element 2 may be covered with the phosphor layer 6. The light emitting body 3A may have a light emitting body lens 39 that covers the light emitting element 2. In the case where the phosphor layer 6 is provided, the light emitting body lens 39 may cover the light emitting element 2 via the phosphor layer 6.

The light emitting body 3B includes the light emitting element 2, a light reflective resin layers 35 covering the side surfaces of the light emitting element 2, and a first electrode 32A and a second electrode 32B disposed at the lower surface of the light emitting element 2.

For example, the first and second electrodes 32A and 32B are electrically connected to the wiring on the second substrate, so that the light emitting element 2 can be electrically connected to the external power source.

The light reflective resin layer 35 reflects the light emitted from the side surface of the light emitting element 2. Thus, the light reflective resin layer preferably contains resin having a high reflectivity for the light emitted from the light emitting element 2, for example, white resin or the like.

The light emitting element 2 may have its upper surface covered with the phosphor layer 6.

MODIFIED EXAMPLE

FIG. 8 illustrates a light emitting device 100A in a modified example of the embodiment of the invention. Unless otherwise specified, the light emitting device 100A may have the same structure as that of the light emitting device 100.

The bottom surface 29A of the lens 9A in the light emitting device 100A has on its end (at the outer periphery of the bottom surface) an inclined part that is inclined with respect to the direction parallel to the upper surface of the mounting substrate 4 (in the X direction of FIG. 8).

In the embodiment shown in FIG. 8, the entire outer extending portion at the bottom surface 29A becomes the inclined part. However, the modified example is not limited to the form shown in FIG. 8. For example, the base end side of the outer extending portion at the bottom surface 29A (on the side close to the mounting substrate 4) may be a flat surface parallel to the upper surface of the mounting substrate 4, and have an inclined part only at its end (or on the end side).

The inclined part is illustrated by a straight line in the cross-sectional view shown in FIG. 8. However, the inclined part has a curved surface (smooth curved surface) obtained by rotating the straight line with respect to an axis parallel to the Z direction The inclined part of the bottom surface 29A has its distal end side (side farther from the mounting substrate 4) positioned at the upper level (in the Z direction of FIG. 8) as compared to the base end.

In the case where the bottom surface 29 is a flat surface, similarly to the light emitting device 100, the light that is emitted obliquely downward from the light emitting element 2 and reaches the boundary between the bottom surface 29 and the upper surface 28 may directly extract from the lens 9. However, in the lens 9A, the light exiting from the boundary between the upper surface and the bottom surface of the lens 9 hits the inclined part and is reflected in the upper direction of the lens 9A. Thus, the light emitting device 100A can improve the light extraction efficiency.

The structures of other components of the lens 9A may be the same as those of the lens 9.

The method for manufacturing the light emitting device 100A will be described below.

Now, only parts different from the manufacturing method of the light emitting device 100 will be described.

FIG. 9 illustrates a cross-sectional view showing the arrangement of the light emitting body 3 disposed in the opening 20 of the shim plate 14A. FIG. 9 corresponds to an enlarged view of a peripheral part of one emitting body of the plurality of the light emitting bodies 3, shown in FIG. 1.

An upper surface 24A of the shim plate 14A has an inclined surface corresponding to the inclined part of the lens 9A.

That is, the inclined surface of the shim plate 14A is inclined with respect to the upper surface of the base 18, and has its distal end side (side farther from the opening 20) positioned at the upper level (in the Z direction of FIG. 9) as compared to the base end side (side closer to the opening 20).

In this way, the shim plate 14A with the upper surface 24A including the inclined surface can be used to produce the light emitting device 100A in the same way as that for the above-mentioned light emitting device 100.

Unless otherwise specified, the shim plate 14A may have the same structure as that of the shim plate 14.

What is claimed is:

1. A method for manufacturing a light emitting device, the light emitting device including a light emitting body with a light emitting element, and a lens sealing an upper surface of the light emitting body, wherein a lower surface of the light emitting body is exposed from a bottom surface of the lens, and the bottom surface extends to an outside of the light emitting body in a top view from a direction vertical to the lower surface of the light emitting body, the method comprising:
   providing a bonding layer on an upper surface of a base;
   disposing a shim plate with an opening on an upper surface side of the bonding layer;
   disposing the light emitting body on the upper surface side of the bonding layer exposed from the opening of the shim plate; and
   forming the lens by approaching a mold having a concave portion at a surface thereof, to the shim plate, covering an upper surface of the light emitting body and an upper surface of the shim plate with a lens formation material within the concave portion, and then hardening the lens formation material,
   wherein the shim plate has a tapered part, and at least a portion of the shim plate has an upper surface located between an upper surface of a mounting substrate of the light emitting body and a lower surface of the mounting substrate in a cross-section view,
   wherein at least a part of the bottom surface extending to an outside of the light emitting body is located between an upper surface of the mounting substrate of the light emitting body and a lower surface of the mounting substrate in a cross-section view, and
   wherein the method further comprises
      removing the shim plate after forming the lens, such that the part of the bottom surface extending to the outside of the light emitting body and located between an upper surface of the mounting substrate of the light emitting body and a lower surface of the mounting substrate in a cross-section view is exposed,
      filling a gap between a side surface of the shim plate at the tapered part and a side surface of the light emitting body with a resin, wherein the gap is filled with the resin from the lower surface of the mounting substrate up to the upper surface of the shim plate, and
      removing all of the resin after forming the lens.

2. The method according to claim 1, wherein the light emitting body has a tapered part narrowed from an upper side to a lower side.

3. The method according to claim 2, wherein, in the disposing of the light emitting body, the tapered part of the shim plate is faced to the tapered part of the light emitting body.

4. The method according to claim 1, wherein
   the lens has at an end of the bottom surface, an inclined part that is inclined with respect to a direction parallel to the upper surface of the light emitting body,
      wherein the shim plate has an inclined surface that is inclined in a direction parallel to an upper surface of the base, and
      wherein the inclined part is formed in the forming of the lens.

5. The method according to claim 1, wherein the lens is formed by transfer molding or compression molding.

6. The method according to claim 1, wherein the opening has a square shape having an arc-shaped curved portion at each corner thereof in a top view.

7. A method for manufacturing a light emitting device, the method comprising:
   providing a bonding layer on an upper surface of a base;
   disposing a shim plate with an opening on an upper surface side of the bonding layer;
   disposing a light emitting body having a light emitting element on the upper surface side of the bonding layer exposed from the opening of the shim plate;
   forming a lens, said lens sealing an upper surface of the light emitting body, by approaching a mold having a concave portion at a surface thereof, to the shim plate, covering an upper surface of the light emitting body and an upper surface of the shim plate with a lens formation material within the concave portion; and
   hardening the lens formation material,
   wherein a bottom surface of the lens extends to an outside of the light emitting body in a top view from a direction vertical to a lower surface of the light emitting body,
   wherein the shim plate has a tapered part and at least a portion of the shim plate has an upper surface located between an upper surface of a mounting substrate of the light emitting body and a lower surface of the mounting substrate in cross section view,
   wherein at least a part of the bottom surface extending to the outside of the light emitting body is located between an upper surface of the mounting substrate of the light emitting body and a lower surface of the mounting substrate in a cross-section view, and wherein the method further comprises removing the shim plate after forming the lens, such that the part of the bottom surface extending to the outside of the light emitting body and located between an upper surface of the mounting substrate of the light emitting body and a lower surface of the mounting substrate in a cross-section view is exposed;

filling a gap between a side surface of the shim plate at the tapered part and a side surface of the light emitting body with a resin, wherein the gap is filled with the resin from the lower surface of the mounting substrate up to the upper surface of the shim plate, and removing all of the resin after forming the lens.

8. The method according to claim 7, wherein the disposing of the light emitting body comprises disposing the light emitting body with a tapered part narrowed from an upper side to a lower side.

9. The method according to claim 7, wherein the forming the lens comprises forming the lens so as to have, at an end of a bottom surface thereof, an inclined part that is inclined with respect to a direction which is parallel to an upper surface of the light emitting body;

wherein the disposing of the shim plate comprises disposing the shim plate with an inclined surface that is inclined in a direction parallel to an upper surface of the base, and wherein the forming of the lens comprises forming the inclined part.

10. The method according to claim 9, wherein the disposing of the light emitting body comprises disposing the light emitting body such that the tapered part of the shim plate is faced to the tapered part of the light emitting body.

11. The method according to claim 7, wherein the forming of the lens comprises forming the lens by transfer molding or compression molding.

12. The method according to claim 7, wherein the opening has a square shape having an arc-shaped curved portion at each corner thereof in a top view.

* * * * *